United States Patent
Pinnow et al.

(10) Patent No.: US 7,084,454 B2
(45) Date of Patent: Aug. 1, 2006

(54) NONVOLATILE INTEGRATED SEMICONDUCTOR MEMORY

(75) Inventors: Cay-Uwe Pinnow, München (DE); Martin Gutsche, Dorfen (DE); Harald Seidl, Pöring (DE); Thomas Happ, Pleasantville, NY (US)

(73) Assignee: Infineon Technologies AG, Munich (DE)

( * ) Notice: Subject to any disclaimer, the term of this patent is extended or adjusted under 35 U.S.C. 154(b) by 1 day.

(21) Appl. No.: 10/950,477

(22) Filed: Sep. 28, 2004

(65) Prior Publication Data
US 2005/0067634 A1    Mar. 31, 2005

(30) Foreign Application Priority Data
Sep. 30, 2003    (DE)    ............... 103 45 475

(51) Int. Cl.
*H01L 29/76*    (2006.01)
(52) U.S. Cl. .............. 257/324; 365/182; 438/954; 257/411
(58) Field of Classification Search ........ 257/324
See application file for complete search history.

(56) References Cited

U.S. PATENT DOCUMENTS 4,335,391 A * 6/1982 Morris ............... 257/324
5,017,505 A   5/1991 Fujii et al.
5,504,022 A * 4/1996 Nakanishi et al. ........ 438/594
5,999,444 A   12/1999 Fujiwara et al.

(Continued)

OTHER PUBLICATIONS

Tiwari S. et al., "Volatile and Non-Volatile Memories in Silicon with Nano-Crystal Storage", IEDM 1995; 4 pages.

(Continued)

*Primary Examiner*—David Nelms
*Assistant Examiner*—Earl Taylor
(74) *Attorney, Agent, or Firm*—Edell, Shapiro & Finnan, LLC

(57) ABSTRACT

A nonvolatile integrated semiconductor memory has an arrangement of layers with a tunnel barrier layer and a charge-storing level. The charge-storing level has a dielectric material which stores scattered in charge carriers in a spatially fixed position. The tunnel barrier layer has a material through which high-energy charge carriers can tunnel. At least one interface surface of the charge-storing level has a greater microscopic roughness than the interface surface of the tunnel barrier layer, which is remote from the charge-storing level. The charge-storing level has a greater layer thickness in first regions than in second regions. This produces a relatively identical distribution and localization of positive and negative charge carriers in the lateral direction. The charge carriers which are scattered into the charge-storing level, therefore, recombine completely, so that the risk of unforeseen data loss during long-term operation of nonvolatile memories is reduced.

15 Claims, 3 Drawing Sheets

U.S. PATENT DOCUMENTS

| | | | |
|---|---|---|---|
| 6,319,775 | B1 | 11/2001 | Halliyal et al. |
| 6,331,465 | B1 | 12/2001 | Forbes et al. |
| 6,451,713 | B1 | 9/2002 | Tay et al. |
| 6,455,372 | B1 | 9/2002 | Weimer |

OTHER PUBLICATIONS

Maayan E. et al., "A 512 Mb NROM Data Storage Memory with 8Mb/s Data Rate", ISSCC 2002, pp. 1-8.

Ingrosso G. et al., "Monte Carlo Simulation of Program and Erase Charge Distribution in NROM Devices", ESSDERC 2002, pp. 187-190.

Fukuda M. et al., "New Nonvolatile Memory with Charge-Trapping Sidewall", IEEE Electron Device Letters, Jul. 2003, pp. 490-492.

Casperson J.D. et al., "Material Issues for Layered Tunnel Barrier Structures", J. APPL Phys. 92(1), 261, 2002, pp. 261-267.

Kang, S.T. et al., "A Study of SONOS Nonvolatile Memory Cell Controlled Structurally by Localizing Charge-Trapping Layer", Proc. IEEE Nonvolatile Semiconductor Memory Workshop 2003, pp. 39-41.

Kang, S.T., et al., "SONOS Memory Devices With a Localized ONO Layer for High Endurance and Good Reliability", Abstract submitted to VLSI, 2003, 2 pages.

\* cited by examiner

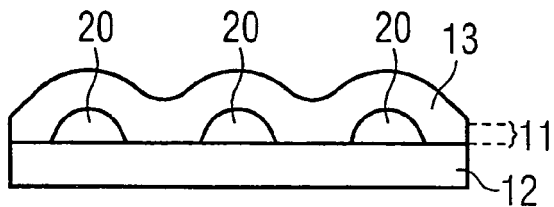
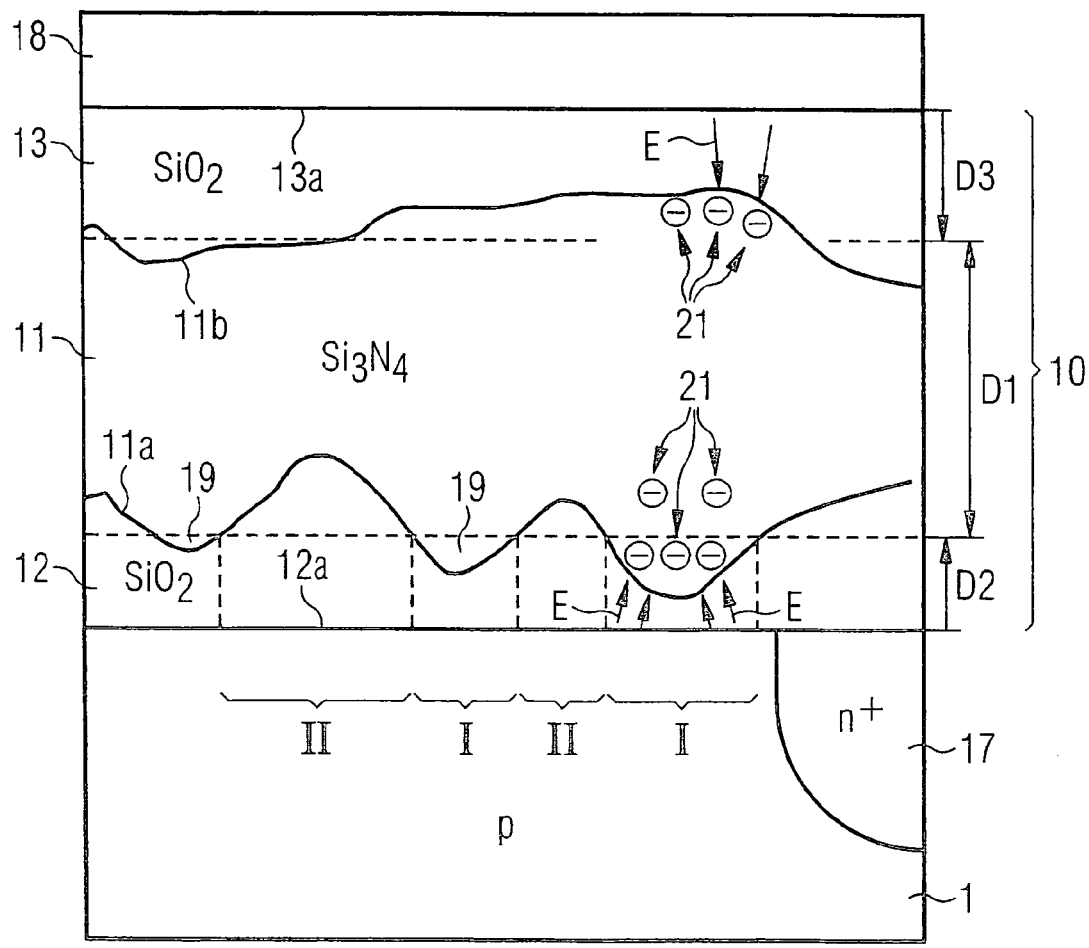
$\varepsilon 3 = 3,9$      $0 \leq d1 \leq 2,0 \cdot D1$
$\varepsilon 1 = 7,6$      $0 \leq d2 \leq 0,85 \cdot D2$
$\varepsilon 2 = 3,9$      $0 \leq d3 \leq 0,85 \cdot D3$

NONVOLATILE INTEGRATED SEMICONDUCTOR MEMORY

CROSS REFERENCE TO RELATED APPLICATIONS

This application claims priority under 35 USC §119 to German Application No. DE 103 45 475.6, filed on Sep. 30, 2003, and titled "Nonvolatile Integrated Semiconductor Memory," the entire contents of which are hereby incorporated by reference.

FIELD OF THE INVENTION

The invention relates to a nonvolatile integrated semiconductor memory, which has a semiconductor substrate and an arrangement of layers having a tunnel barrier layer and a charge-storing level.

BACKGROUND

In semiconductor memories of this type, a nitride layer is often used as the charge-storing level and is surrounded on both sides by a thin oxide layer, for example, of silicon dioxide. In this three-layer sequence, the nitride layer and the oxide layers are in each case very thin; their layer thicknesses are typically a few dozen nanometers. In at least one of the oxide layers, a tunneling mechanism is used where charge carriers are accelerated between two electrodes in the lateral direction parallel to the substrate surface in channel regions of transistor structures. Just before the charge carriers reach the target electrode, some charge carriers reach such a high energy that, as a result of scatter effects, the charge carriers can be scattered through a thin oxide layer arranged on the substrate surface and as a result penetrate into a layer arranged above. Provided that a nitride layer, which retains the charges in a spatially fixed position is arranged above the oxide layer, this tunneling mechanism can be put to technological use to permanently store a digital information item in, for example, a silicon nitride layer. Charge quantities can be stored in localized form, in particular, above edge regions of electrodes arranged in the substrate, where the high-energy electrons (hot channel electrons) reach their highest kinetic energy. Since a nitride layer spatially retains scattered-in charge carriers and prevents them from migrating through the nitride layer, at least if the temperature is not excessively high, two independent digital information items can be stored in a nitride layer, for example, above two pn junctions of a field-effect transistor.

Therefore, the nitride layer in an oxide-nitride-oxide arrangement of layer forms a trapping layer, i.e., a layer which retains scattered-in charges. To store a digital information item, a sufficiently large number of charge carriers, for example electrons or defect electrons, have to be scattered into the charge-storing level in a spatially concentrated form. A digital information item of this type is erased by introduction of the opposite type of charge carrier. In the case of a digital information item formed from scattered-in charge carriers, this information item is erased by the introduction of defect electrons, and vice versa. The alternate scattering-in of electrons and defect electrons is effected by adjustment of the potentials of the electrodes.

If store, erase, and charge reversal operations are carried out repeatedly, electrons and defect electrons, which are scattered into the charge-storing level through the tunnel barrier layer, may not recombine. Instead, a certain quantity of electrons and defect electrons remains in the charge-storing level and these electrons and defect electrons recombine with one another at elevated temperatures, such as in tests to simulate ageing phenomena after long-term storage for a number of years.

The cause of the electrons and defect electrons remaining in the charge-storing level is different lateral density distributions of the scattered-in electrons and of the scattered-in defect electrons with respect to the substrate surface. Since the electrical potentials of source/drain electrodes and gate electrodes required to scatter-in defect electrons are different than in the case of scattered-in electrons, the position of the scattered-in defect electrons in the xy plane of the nitride layer with respect to the substrate surface is different than in the case of the electrons. As a result, in the event of an erase or charge reversal operation, a certain proportion of the scattered-in charge quantity is erased or written over. As a result, the storage properties of the integrated semiconductor memory gradually deteriorate, and increases in temperature can lead to a sudden, at least partial loss of charge, i.e., to a loss of the stored digital information item. Moreover, the net charge formed by the sum of the scattered-in electrons and defect electrons and consequently also the long-term storage capacity of the semiconductor memory are reduced.

It has in some instances been proposed to laterally pattern the arrangement of layers, in order to restrict the region in which electrons and defect electrons can penetrate into the charge-storing level in the lateral direction parallel to the substrate surface. However, this would require lithographic process steps, which would increase the work involved and the costs entailed by the fabrication of the integrated semiconductor memory. Furthermore, it has been proposed to increase the long-term storage capacity of the semiconductor memory by incorporating nanocrystals of semiconducting material, such as, for example, silicon or germanium, in the charge-storing level. In this case, however, the charge carriers are retained by potential differences with respect to the matrix dielectric.

A nonvolatile integrated semiconductor memory with a reduced risk of the recombination of electrons and defect electrons, which have remained in the charge-storing level after repeated reprogramming and which has a higher long-term storage capacity, is desirable.

SUMMARY

A nonvolatile integrated semiconductor memory can include at least one interface surface of the charge-storing level with a greater microscopic roughness than the interface surface of the tunnel barrier layer which is remote from the charge-storing level, and a charge-storing level with a greater layer thickness in first regions than in second regions.

For example, a common interface surface of the charge-storing level and the tunnel barrier layer has a greater microscopic roughness than the interface surface of the tunnel barrier layer, which is remote from the charge-storing level. The tunnel barrier layer is relatively thinner and relatively easier to tunnel through in first regions of the common interface surface, where the charge-storing level has elevations facing in the direction of the tunnel barrier layer. The tunnel barrier layer is relatively thicker and relatively more difficult to tunnel through in second regions of the common interface surface, where the charge-storing level is relatively thinner than in first regions.

According to the invention, instead of conventional solution approaches which relate to lithographic patterning steps or the incorporation of foreign particles, the form of the interface surface between the charge-storing level and the tunnel barrier layer is altered. Contrary to lithographic solution approaches, it is not necessary to have detailed knowledge of the precise lateral position of scattered-in charge quantities (electrons or defect electrons), provided that the charge distributions of scattered-in electrons and defect electrons substantially coincide with one another in the lateral direction. According to the invention, a self-aligning setting of the lateral distribution of scattered-in charge carriers is achieved because the interface surface between the tunnel barrier layer and the charge-storing level has a relatively greater roughness than the opposed interface surface of the tunnel barrier layer. As a result, the common interface surface of the two layers influences on the layer thickness of the tunnel barrier layer.

The roughness of a layer surface or an interface surface between two layers is usually a disruptive factor in semiconductor fabrication and is minimized by using sufficiently slow layer growth, by using sufficiently low concentrations of materials to be deposited or, if necessary, by planarization operations, for example, by chemical mechanical planarization. A person skilled in the art has at a wide range of different layer deposition processes, which he can vary by a large number of physical or chemical parameters, for example, the temperature, the pressure, the concentration of chemical substances supplied, etc. It is customary for these parameters to be optimized such as to achieve as smooth a layer surface as possible. The same parameters, if not set optimally, lead to a less smooth, rough surface. The possibilities for achieving a rough surface are as numerous as the deposition processes, which are customarily used, and the parameters, which have to be set in these processes.

The process and procedures for producing a rough surface, rather than a smooth surface, are therefore known to the person skilled in the art. According to the invention, it is for the first time proposed that the roughness, i.e., the extent of elevations and depressions in the common interface surface between the charge-storing level and the tunnel barrier layer, be maximized to achieve a technical effect. According to the invention, a lateral localization of charge carriers is achieved by the locally fluctuating layer thickness of the charge-storing level. In first regions, where the layer thickness of the charge-storing level is relatively greater, an electric field within adjacent layers of lower dielectric constant is stronger and promotes introduction of charge carriers into the thickened first regions of the charge-storing level. In second regions, by contrast, where the charge-storing level has a lower layer thickness, the electric field is relatively lower in adjacent layers of a lower dielectric constant. There, the probability of tunneling is relatively reduced compared to the first regions.

Moreover, the quantum-mechanical energy levels possessed by the charge carriers in the charge-storing level, are relatively deeper in the first, thickened regions of the charge-storing level than in the second regions. As a result, charge carriers are automatically introduced into the first lateral surface regions.

Finally, the electric field also has a lateral field strength component, which faces from the second regions toward the adjacent first region, thereby boosting the tendency toward lateral concentration of charge carriers.

The measure of varying the layer thickness of the charge-storing level to be rough in the lateral direction, i.e., of configuring at least one interface surface of the charge-storing level with local elevations and/or thickened portions, allows the introduction of electrons and defect electrons into substantially coinciding microscopic surface regions.

The effect, which is utilized in accordance with the invention, is self-aligning during the operating phase of the integrated semiconductor memory. Electrons or defect electrons, which have been scattered into the nitride layer through the tunnel oxide, penetrate into those regions of the charge-storing level, which are located above locations where the layer thickness of the tunnel barrier layer is relatively low. Those regions of the charge-storing level which are located above regions with a high layer thickness of the tunnel barrier, remain substantially free of charge carriers. The microscopic topography of the boundary layer, between the charge-storing level and the tunnel barrier layer which is used in accordance with the invention therefore imposes relatively coinciding charge distributions of scattered-in electrons and scattered-in defect electrons.

The second interface surface of the tunnel barrier layer has a relatively low roughness such that the tunnel barrier layer levels out microscopic layer thickness fluctuations in the charge-storing level. In this case, the elevations and depressions of the interface surface of the tunnel barrier layer which is remote from the charge-storing level, are relatively small such that the layer thickness of the tunnel barrier layer is in a first approximation determined by the height profile of the interface surface with the charge-storing level.

The tunnel barrier layer has a mean layer thickness of between 1 and 20 nm and that roughness induced local layer thickness fluctuations amount to at most 200% of the mean layer thickness of the tunnel barrier layer. The layer thickness fluctuations must not be so great that the tunnel barrier layer has a local leak.

The electric field drops most steeply across the layer thickness of the tunnel barrier layer at locations where the tunnel barrier layer has the lowest layer thickness. This effect is independent of the side of the tunnel barrier layer from which the electrons tunnel to the other side, i.e., whether electrons or defect electrons are penetrating into the charge-storing level through the tunnel barrier layer. Provided that the layer thickness differences in the tunnel barrier layer are sufficiently pronounced, this allows a targeted introduction of electrons and defect electrons into identical microscopically small regions, which are located above or below relatively thin regions of the tunnel barrier layer, and therefore, attract the strongest electric fields to them. These surface regions, where charge carriers of both signs accumulate, do not need to be known in detail, especially since their lateral dimensions are relatively small that the lateral dimension are lithographically patterned.

As an alternative, the tunnel barrier layer has a layer thickness, which is constant in the lateral direction. In this case too, according to the invention, lateral localization of charge carriers by locally fluctuating layer thickness of the charge-storing level. In first regions, where the layer thickness of the charge-storing level is relatively greater, the insulation layer arranged above the charge storing has a thinner layer thickness. If the charge-storing level has a higher dielectric constant than the insulation layer arranged above, a locally increased electric field occurs, when an electric field is applied perpendicular to the layer plane, in the first regions, where the charge-storing level has a greater layer thickness. In second regions, by contrast, in which the charge-storing level has a lower layer thickness, the electric field is lower in the adjacent layers. There, the probability of tunneling is reduced compared to the first regions. Moreover, the electric field has a lateral field strength component which faces from the second regions toward the adjacent first region, and thereby boosts the tendency toward lateral concentration of charge carriers. The tunnel barrier layer of constant layer thickness increases the ability of the charge-storing level to store charge carriers which are introduced just once permanently, even in the event of possibly unfavorable electric field conditions, compared to a tunnel barrier layer with a spatially non-homogenous layer thickness.

Furthermore, the charge-storing level has a mean layer thickness of between 1 and 20 nm, and that roughness-induced local layer thickness fluctuations amount to at least 10% and at most 200% of the mean layer thickness of the charge-storing level. The fluctuations in the layer thickness of the charge-storing level may result exclusively from the topographic profile of the interface surface with the tunnel barrier layer, but may also be influenced by a further interface surface of the charge-storing level.

Alternatively, the charge-storing level is formed from a plurality of laterally isolated island regions of the dielectric material. The charge-storing level is not a continuous layer. The island regions, which are spatially isolated from one another, impose lateral localization of the charge carriers in the charge-storing level due to their isolated position.

According to an embodiment, the tunnel barrier layer is arranged on the surface of the semiconductor substrate and extends over a channel region of the semiconductor substrate between a first doped region and a second doped region. In this case, the doped regions are lithographically patterned in the lateral direction, whereas the roughness-induced microscopic layer thickness fluctuations in the tunnel barrier layer and/or the charge storing level have relatively smaller dimensions in the lateral direction, typically, for example, 1 to 20 nm.

In one embodiment, the arrangement of layers has two tunnel barrier layers, between which the charge-storing level is arranged. The arrangement of layers may be an ONO arrangement of layers (oxide-nitride-oxide), where each layer is on average at most, for example, 25 nm thick. In this case, a tunneling effect can optionally be utilized in both tunnel barrier layers or in one of the two tunnel barrier layers, depending on the level of electrode potentials in the vicinity of the arrangement of layers. Since the roughness of the interface surface between at least one tunnel barrier layer which is used in accordance with the invention causes charges which are scattered into the charge-storing level to be scattered predominantly into elevations, i.e., into regions of locally increased layer thickness, of the charge-storing level, overall the mean layer thickness of the charge-storing level can be lower than in the case of a conventional semiconductor memory.

The arrangement of layers is covered by a gate electrode, which extends from a region above the first doped region to a region above the second doped region. With the aid of the gate electrode and the first and second doped regions, it is possible, by corresponding changes in potential in the channel region, to form a channel of electrons or defect electrons extending from one doped region to the other, with a difference in potential between the gate electrode and the substrate effecting an electric field through the two tunnel barrier layers and through the charge-storing levels. This electric field can be used to scatter in charge carriers through the tunnel barrier layers.

The charge-storing level, above edge regions of optionally the first doped region or the second doped region, can be locally electrically charged by high-energy charge carriers from the channel region. Channel electrons flowing from the first doped region to the second doped region or vice versa reach their maximum velocity at the end of the channel section, and there the high-energy component of the channel electrons under the action of the potential of the gate electrode at the edge of the respective doped region is scattered through the tunnel barrier layer into the charge-storing level. By suitably selecting the potentials, this recharging operation of the charge-storing level takes place at the edge of the first doped region or at the edge of the second doped region. As a result, two digital information units can be stored per transistor structure, thereby doubling the storage density on the substrate. Discharge operations for charge reversal or erasing of a stored information item can be carried out selectively at the edge of the first doped region or at the edge of the second doped region in a corresponding way.

The doped regions are source/drain regions of a storage transistor. The doped regions may be arranged beneath a thickened oxide. The layer thickness of the thickened oxide decreases toward the channel region and in the channel region, so that the oxide there serves as a tunnel barrier layer.

The dielectric material of the charge-storing level has a higher dielectric constant than the dielectric of the tunnel barrier layer. The difference between the two dielectric constants is, for example, at least 2.0, in order to allow sufficiently controlled scattering of the electrons and defect electrons exclusively into the first regions of the charge-storing level. In the case of silicon nitride as dielectric material of the charge-storing level, the dielectric constant of the latter is 7.6, as against a dielectric constant of 3.9 for silicon oxide as dielectric of the tunnel barrier layer. Accordingly, the charge-storing level can include, for example, an oxide, a nitride or an oxynitride. Examples of suitable materials include silicon nitride, silicon oxide, aluminum oxide, hafnium oxide, tantalum oxide or lanthanum oxide. The tunnel barrier layer may include an oxide, for example, silicon oxide.

BRIEF DESCRIPTION OF THE FIGURES

The invention is described below with reference to the figures, in which:

FIG. 6 shows an arrangement of layers in accordance with a fourth embodiment of the invention, FIG. 7 shows an enlarged partial view from FIG. 1.

DETAILED DESCRIPTION

Figure 1:
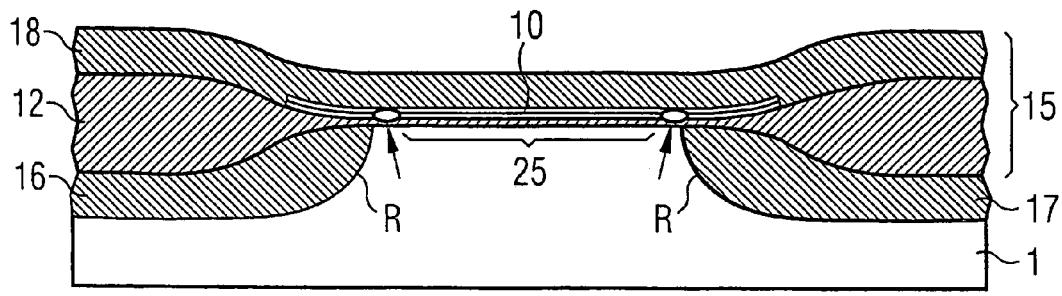
FIG. 1 shows a cross section through a semiconductor memory according to the invention having an arrangement of layers comprising a charge-storing level and two tunnel barrier layers.

FIG. 1 shows a nonvolatile integrated semiconductor memory having a substrate 1 and an arrangement of layers 10, which will be described in more detail with reference to FIGS. 2 to 5. The arrangement of layers includes a charge-storing level and a layer 12 which is arranged beneath the charge-storing level and is relatively thin over a channel region 25. The layer 12 serves as a tunnel barrier layer for electrons and defect electrons which are to be scattered into the charge-storing level. The layer 12 is relatively thicker laterally outside the channel region 25, where the layers serve to electrically insulate a first doped region 16 and a second doped region 17 with respect to a gate electrode 18 of a transistor structure 15. The, for example, strongly n-doped regions 16 and 17 represent source/drain electrodes of the transistor structure 15, between the edge regions R where a channel is formed given suitably selected electrode potentials. Above the edge regions R there are regions of the arrangement of layers, indicated by the arrows illustrated in FIG. 1 and the ringed parts, in which high-energy charge carriers produced when a channel is formed are scattered into the charge-storing level. Depending on the magnitude of the electrode potentials and on the direction of flow of the channel, a digital information item is stored, erased or rewritten either at the edge R of the first doped region 16 or at the edge R of the second doped region 17. Therefore, the transistor structure 15 reproduced can be used to store two bits.

Figure 2:
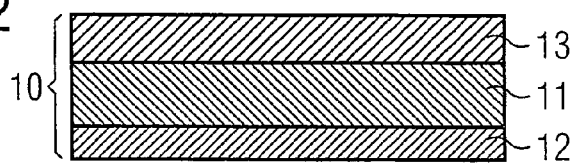
FIG. 2 shows an arrangement of layers in accordance with the prior art.

FIG. 2 shows an enlarged detail view of the arrangement of layers from FIG. 1 in the case of a conventional semiconductor memory. In accordance with FIG. 2, the charge-storing level 11, which is surrounded by two tunnel barrier layers 12 and 13, is delimited on both sides by interface surfaces which do not have a microscopic roughness and a topographic profile which is predetermined by the macroscopic, lithographically patterned structures of the semiconductor memory. The layer 11 is conformal with respect to these structures. On a microscopic scale, by contrast, its interface surfaces with the adjacent tunnel barrier layers are smooth, i.e., do not have any elevations or depressions.

Figure 3:
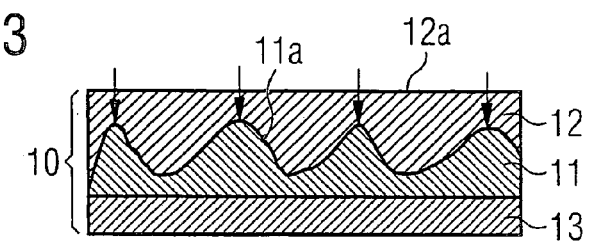
FIG. 3 shows an arrangement of layers in accordance with a first embodiment of the invention.

FIG. 3 shows an arrangement of layers 10 from FIG. 1 in accordance with a first embodiment of the invention. In this case, the charge-storing level 11 has an interface surface 11a with a first tunnel barrier layer 12, and this interface surface 11a has a relatively greater roughness than a second interface surface 12a of the tunnel barrier layer 12, which is remote from the charge-storing level 11. The second interface surface 12a in FIG. 3 is planar even on a microscopic scale, whereas the interface surface 11a has elevations in the direction of the tunnel barrier layer 12 and valleys or depressions between these elevations. The tunnel barrier layer 12 is particularly thin above the elevations, as indicated by the arrows shown in the illustration. It is preferable for a further layer 13, which can likewise serve as a tunnel barrier layer, to be provided on the opposed side of the charge-storing level 11. Whereas in FIG. 3 the layer thickness of the top layer 12 varies, the layer 12 may also be applied with a homogenous layer thickness.

Figure 4:
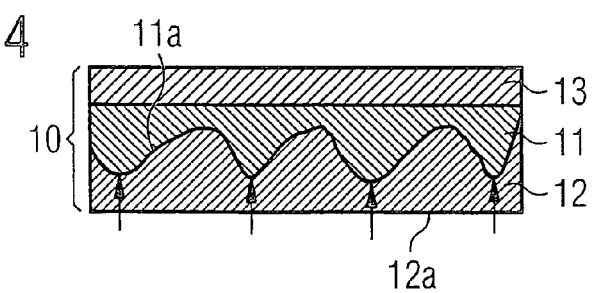
FIG. 4 shows an arrangement of layers in accordance with a second embodiment of the invention.

FIG. 4 shows an arrangement of layers 10 from FIG. 1 in accordance with a second embodiment of the present invention. In this case, the tunnel barrier layer 12, which is separated from the charge-storing level 11 by an interface surface 11a of roughness, is located beneath the charge-storing level 11 and toward the side of the semiconductor substrate 1 effects a lateral concentration of scattered-in charge carriers in the region of the first regions, where characterized by the arrows and in which the layer thickness of the tunnel barrier layer 12 is particularly low. A further tunnel barrier layer 13 or some other form of dielectric layer 13 is located on the top side.

Figure 5:
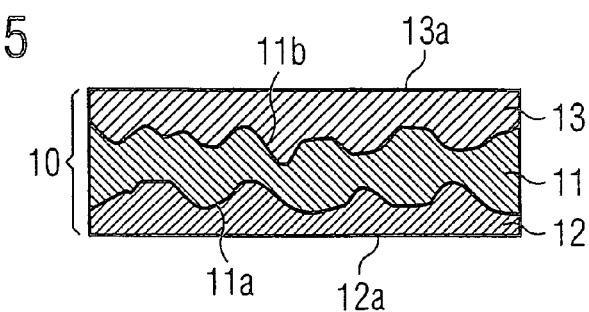
FIG. 5 shows an arrangement of layers in accordance with a third embodiment of the invention.

FIG. 5 shows an arrangement of layers 10 from FIG. 1 in accordance with a third embodiment of the present invention. In this case, both interface surfaces 11a, 11b are formed as layers with a high roughness which exceeds the roughness of the opposite interface surfaces 12a and 13a. In this case, tunneling currents which penetrate through both the first tunnel barrier layer 12 and the second tunnel barrier layer 13 can be restricted in the lateral direction to regions, which are where predetermined in a self aligning fashion and the layer thickness of the respective first or second tunnel barrier layer 12 or 13 is relatively thin.

FIG. 6 shows an arrangement of layers 10 from FIG. 1 in accordance with a fourth embodiment of the present invention. In this case, the charge-storing level 11 is formed from a plurality of laterally isolated island regions 20 of the dielectric material. The spatially delimited island regions boost the tendency toward lateral localization of the charge carriers in the charge-storing level 11. Therefore, the charge-storing level 11 need not be formed as a continuous layer.

In the embodiments, perpendicular to the arrangement of layers, the charge-storing level 11, in the direction, follows the layer profile of the layer 12 and of the layer 13; therefore, the charge-storing level has the topographic fluctuations in its vertical position which are customary in integrated semiconductor circuits.

FIG. 7 shows an enlarged detail view from FIG. 1, where the two interface surfaces 11a and 11b of the charge-storing level 11 have a roughness than the respectively opposed interface surfaces 12a and 13a of the adjacent tunnel barrier layers 12 and 13. The semiconductor substrate 1 and an edge region of the second doped region 17 are arranged beneath this arrangement 10 of layers. The gate electrode 18 runs above the arrangement 10 of layers. In FIG. 7, the first regions I, where the common interface surface 11a of the charge-storing level 11 and the tunnel barrier layer 12 has elevations facing toward the tunnel barrier layer 12, are indicated using the example of the lower tunnel barrier layer 12. Furthermore, second regions II are indicated, where the charge-storing level 11 has a lower layer thickness than in the first regions I. The charge-storing level 11 can substantially include silicon nitride with a dielectric constant of 7.6, whereas the tunnel barrier layer 12 and the further tunnel barrier layer 13 include silicon oxide with a dielectric constant of 3.9.

In the case of a channel current having, for example, electrons flowing toward the right in the direction of the edge region of the second doped region, some high-energy electrons 21 are scattered through the layer 12 into the charge-storing level 111 due to an electric field E, which occurs in the region of elevations, facing toward the layer 12, of the interface surface 11a. The strength of the electric field in the region, where the layer thickness of the layer 12 is locally lower, i.e., in the lateral surface regions I, occurs independently of the sign of the charge carriers, which are to be scattered into the layer 11. Therefore, distributions of scattered-in electrons or defect electrons which are strongly localized in the lateral direction and coincide with one another are produced, since the local layer thickness, which determines the dielectric field strength E, of the tunnel barrier layer 12 is relatively identical for both types of charge carrier. As a result, even after repeated reprogramming of the semiconductor memory, accumulations of electrons and defect electrons arranged close together in the charge-storing level 11 can be avoided and may no longer lead to data losses, as is customary at elevated temperatures or after use for a number of years.

In a similar way, in the region of the interface surface 11b, which adjoins the further tunnel barrier layer 13, a lateral localization of electrons 21 or defect electrons is achieved in the region of relatively strong field strength E, i.e., a relatively low layer thickness D3 of the layer 13. Taken as an average over various lateral positions, layer thickness fluctuations d1, d2 and d3 may vary between 10% and 85% of the mean layer thickness D1, D2 or D3 of the charge-storing level 11 or the corresponding tunnel barrier layer 12, 13, respectively.

Figure 8:
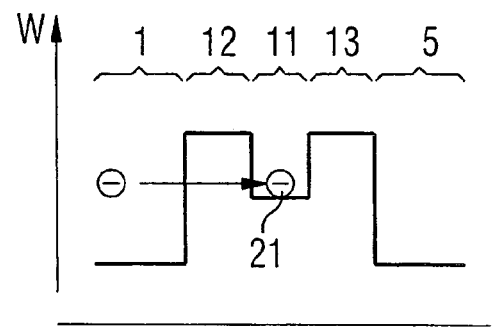
FIG. 8 shows a diagrammatic band edge profile in the direction perpendicular to the surface of the arrangement of layers.

FIG. 8 diagrammatically depicts a band edge profile W in the direction perpendicular to the surface of the arrangement 10 of layers. In the region of the substrate 1 and the gate electrode 5, the energy profile W, for example for electrons 21, has such a low energy level that electrons, in particular, kinetically excited electrons in the channel region of the substrate 1, have a relatively high energy, which is sufficient to tunnel through the higher tunnel barrier in the region of the tunnel barrier layer 12 and to enter the charge-storing level 11. The electric field, which leads to the penetration of the electrons 21 into the charge-storing level 11, is achieved using a sufficiently high potential in the gate electrode 5. The electric fields which are thereby caused in various lateral regions of the arrangement 10 of layers depend on the corresponding layer thickness of the tunnel barrier layer 12, which exhibits relative local variation due to the roughness of the tunnel barrier layer 12 used according to the invention.

Figure 9:
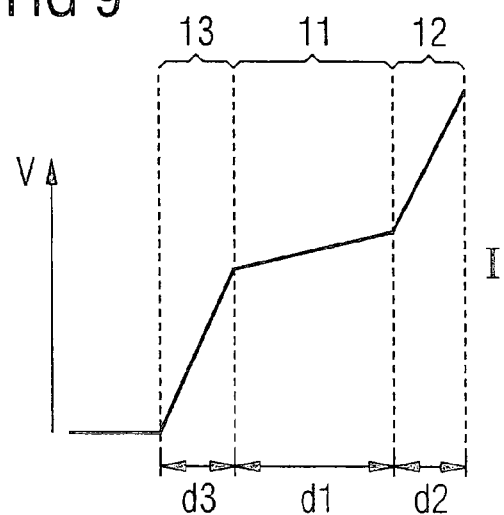
FIG. 9 shows a potential curve through the arrangement of layers in first regions of the charge-storing level and of the tunnel barrier layer.

FIG. 9 shows a potential curve of electrons in the direction perpendicular to the surface of the arrangement 10 of layers in the region of the tunnel barrier layer 12 and of the charge-storing level 11 and a further dielectric layer 13 in those first regions I above the substrate surface where the layer thickness d1 of the charge-storing level 11 is relatively high. The remaining layers 12 and 13 of the layer sequence 10 have a low layer thickness in the first regions I; in these layers 12 and 13, therefore, the electric field strength is particularly high, as can be recognized, for example, from the strong rise in the potential V in the tunnel barrier layer 12.

Figure 10:
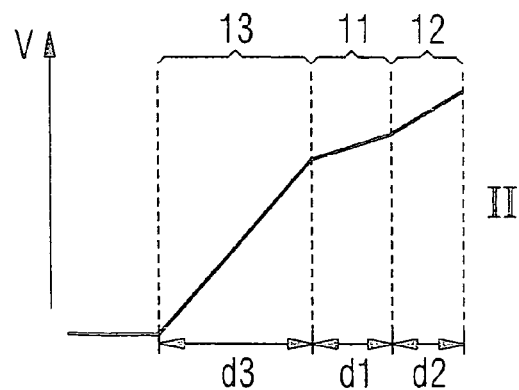
FIG. 10 shows a potential curve in second regions of the charge-storing level and of the tunnel barrier layer.

FIG. 10 shows the potential curve in second regions II, where the layer thickness d2 of the charge-storing level 11 is relatively lower than in the first regions I. The layers 12 and 13 of relatively low dielectric constant overall have a lower layer thickness in the second regions than in the first regions I, with the result that in the layers 12 and 13 the electric field is lower in the second regions than in the first regions I. The lateral layer thickness variation of the charge-storing level, therefore, results in a laterally non-homogenous field distribution in the layers 12 and 13, which in the tunnel barrier layer 12 leads to a lateral concentration and localization of the charge carriers introduced into the charge-storing level 11.

A plurality of microscopically small unevenness formations are present in the edge region R (FIG. 1) of the first and second doped regions 16, 17. Therefore, the scattering of high-energy charge carriers via the edge region R of the respective doped region 16, 17 leads to the incorporation of charge carriers into a plurality of first regions I of the charge-storing level 11. These regions correspond to the elevations, facing toward the tunnel barrier layer 12, of the common interface surface 11a, and consequently the microscopic roughness leads to a self-aligning localization of scattered-in charge carriers in the lateral direction parallel to the substrate surface.

The lateral charge carrier concentration, which is brought about in accordance with the invention by the roughness of the interface surface 11a, is further boosted by the effect, whereby the locally fluctuating layer thickness of the charge-storing level 11 and of the tunnel barrier layer 12 also lead to a quantum-mechanical change in the electron potentials, in which in particular, the regions with a high layer thickness of the charge-storing level 11, corresponding to a wide quantum-mechanical one-dimensional potential well, locally reduces the additional states for charge carriers, whereas the relative lower layer thickness of the charge-storing level 11 in second regions II leads to an increase in energy levels and thereby keeps scattered-in charge carriers away from the second regions II.

The randomly distributed first regions I form individual, isolated or, in some cases, also partially contiguous island regions of microscopic dimensions above the substrate surface. It is not necessary to know their exact position, since a sufficient roughness of the interface surface 11a automatically leads to lateral localization of scattered-in charge carriers on a microscopic scale.

In addition to silicon nitride, it is also possible, for example, for hafnium oxide, zirconium oxide, aluminum oxide, mixtures thereof or other materials with a relatively high dielectric constant to be used as material for the charge-storing level. Suitable deposition processes include either atomic layer deposition, chemical vapor deposition, physical vapor deposition, or sputtering.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols 1 semiconductor substrate
5 gate electrode
10 arrangement of layers
11 charge-storing level
11a; 11b interface surfaces of the charge-storing level
12 tunnel barrier layer
12a first opposed interface surface
13 further tunnel barrier layer
13a second opposed interface surface
15 transistor structure
16 first doped region
17 second doped region
18 gate electrode
19 elevation
20 island region
21 scattered-in charge carriers
25 channel region
D1, D2, D3 mean layer thicknesses
d1, d2, d3 layer thickness fluctuation
E electric field
$\epsilon_1, \epsilon_2, \epsilon_3$ dielectric constant
R edge region
V potential
W energy

What is claimed:

1. A nonvolatile integrated semiconductor memory, comprising:
   a semiconductor substrate; and
   an arrangement of layers including a tunnel barrier layer and a charge-storing level, the charge-storing level comprising a dielectric material that stores scattered-in charge carriers in a spatially fixed position, and the tunnel barrier layer having a common interface surface with the charge-storing level and a further interface surface that is remote from the charge-storing level, the tunnel barrier layer comprising a dielectric through which high-energy charge carriers can tunnel, wherein at least one interface surface of the charge-storing level has a greater microscopic roughness than the further interface surface of the tunnel barrier layer that is remote from the charge-storing level, the charge-storing level having a greater layer thickness in first regions than in second regions.

2. The semiconductor memory as claimed in claim 1, wherein the further interface surface of the tunnel barrier layer has a relatively low roughness such that the tunnel barrier layer levels out microscopic layer thickness fluctuations of the charge-storing level.

3. The semiconductor memory as claimed in claim 1, wherein the tunnel barrier layer has a mean layer thickness of between 1 and 20 nm, and wherein roughness-induced local layer thickness fluctuations amount to at most 85% of the mean layer thickness of the tunnel barrier layer.

4. The semiconductor memory as claimed in claim 1, wherein the tunnel barrier layer has a layer thickness that is constant in lateral directions.

5. The semiconductor memory as claimed in claim 1, wherein the charge-storing level has a mean layer thickness of between 1 and 20 nm, and wherein roughness-induced local layer thickness fluctuations amount to at least 10% and at most 200% of the mean layer thickness of the charge-storing level.

6. The semiconductor memory as claimed in claim 1, wherein the charge-storing level is formed from a plurality of laterally isolated island regions of the dielectric material.

7. The semiconductor memory as claimed in claim 1, wherein the tunnel barrier layer is arranged directly on the surface of the semiconductor substrate and extends over a channel region of the semiconductor substrate between a first doped region and a second doped region.

8. The semiconductor memory as claimed in claim 1, wherein the arrangement of layers includes two tunnel barrier layers and the charge-storing level is arranged between the two tunnel barrier layers.

9. The semiconductor memory as claimed in claim 7, wherein the arrangement of layers is covered with a gate electrode that extends from a region above the first doped region to a region above the second doped region.

10. The semiconductor memory as claimed in claim 7, wherein the charge-storing level above edge regions of the first doped region or the second doped region is locally electrically chargeable by high-energy charge carriers from the channel region.

11. The semiconductor memory as claimed in claim 7, wherein the doped regions are source/drain regions of a memory structure of a storage transistor.

12. The semiconductor memory as claimed in claim 1, wherein the dielectric material of the charge-storing level has a higher dielectric constant than the dielectric of the tunnel barrier layer.

13. The semiconductor memory as claimed in claim 1, wherein the charge-storing level comprises at least one of an oxide, a nitride, and an oxynitride.

14. The semiconductor memory as claimed in claim 1, wherein the tunnel barrier layer comprises an oxide.

15. The semiconductor memory as claimed in claim 14, wherein the oxide is a silicon oxide.

* * * * *